United States Patent
Wang et al.

(10) Patent No.: US 10,283,403 B2
(45) Date of Patent: May 7, 2019

(54) METHOD OF FORMING TRENCHES WITH DIFFERENT DEPTHS

(71) Applicant: Taiwan Semiconductor Manufacturing Co., Ltd., Hsinchu (TW)

(72) Inventors: Chao-Hsun Wang, Taoyuan County (TW); Hsien-Cheng Wang, Hsinchu (TW); Mei-Yun Wang, Hsin-Chu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 15/722,133

(22) Filed: Oct. 2, 2017

(65) Prior Publication Data
US 2018/0025938 A1    Jan. 25, 2018

Related U.S. Application Data

(63) Continuation of application No. 15/178,229, filed on Jun. 9, 2016, now Pat. No. 9,779,984.
(Continued)

(51) Int. Cl.
*H01L 21/311*    (2006.01)
*H01L 21/768*    (2006.01)
(Continued)

(52) U.S. Cl.
CPC .. *H01L 21/76816* (2013.01); *H01L 21/31111* (2013.01); *H01L 21/31116* (2013.01);
(Continued)

(58) Field of Classification Search
CPC ......... H01L 21/76816; H01L 21/31111; H01L 21/76831; H01L 23/485; H01L 29/0847;
(Continued)

(56) References Cited

U.S. PATENT DOCUMENTS 7,037,774 B1 *  5/2006  Syau ................ H01L 21/76816
                                                   257/E21.507
7,667,271 B2    2/2010  Yu et al.
(Continued)

FOREIGN PATENT DOCUMENTS

KR    20000056461    9/2000
KR    20060040462    5/2006
KR    20140028978    3/2014

*Primary Examiner* — Nathan W Ha
(74) *Attorney, Agent, or Firm* — Haynes and Boone, LLP

(57) ABSTRACT

A semiconductor device includes a gate structure disposed over a substrate, and a first dielectric layer disposed over the substrate, including and over the gate structure. A first metal feature is disposed in the first dielectric layer, including an upper portion having a first width and a lower portion having a second width that is different than the first width. A dielectric spacer is disposed along the lower portion of the first metal feature, wherein the upper portion of the first metal feature is disposed over the dielectric spacer. A second dielectric layer is disposed over the first dielectric layer, including over the first metal feature and a second metal feature extends through the second dielectric layer to physically contact with the first metal feature. A third metal feature extends through the second dielectric layer and the first dielectric layer to physically contact the gate structure.

20 Claims, 11 Drawing Sheets

Related U.S. Application Data

(60) Provisional application No. 62/313,472, filed on Mar. 25, 2016.

(51) Int. Cl.
  *H01L 29/43* (2006.01)
  *H01L 29/08* (2006.01)
  *H01L 21/8234* (2006.01)
  *H01L 29/40* (2006.01)
  *H01L 23/485* (2006.01)

(52) U.S. Cl.
  CPC ............... *H01L 21/76831* (2013.01); *H01L 21/823475* (2013.01); *H01L 23/485* (2013.01); *H01L 29/0847* (2013.01); *H01L 29/401* (2013.01); *H01L 29/435* (2013.01); *H01L 21/76895* (2013.01)

(58) Field of Classification Search
  CPC ....... H01L 21/31116; H01L 21/823475; H01L 29/401
  See application file for complete search history.

(56) References Cited

U.S. PATENT DOCUMENTS

| | | | |
|---|---|---|---|
| 7,910,453 B2 | 3/2011 | Xu et al. | |
| 8,377,779 B1 | 2/2013 | Wang | |
| 8,399,931 B2 | 3/2013 | Liaw et al. | |
| 8,652,894 B2 | 2/2014 | Lin et al. | |
| 8,686,516 B2 | 4/2014 | Chen et al. | |
| 8,716,765 B2 | 5/2014 | Wu et al. | |
| 8,723,272 B2 | 5/2014 | Liu et al. | |
| 8,729,627 B2 | 5/2014 | Cheng et al. | |
| 8,735,993 B2 | 5/2014 | Lo et al. | |
| 8,736,056 B2 | 5/2014 | Lee et al. | |
| 8,722,109 B1 | 7/2014 | Colinge | |
| 8,785,285 B2 | 7/2014 | Tsai et al. | |
| 8,816,444 B2 | 8/2014 | Wann et al. | |
| 8,823,065 B2 | 9/2014 | Wang et al. | |
| 8,860,148 B2 | 10/2014 | Hu et al. | |
| 9,105,490 B2 | 8/2015 | Wang et al. | |
| 9,779,984 B1* | 10/2017 | Wang | H01L 21/76816 |
| 2005/0202666 A1* | 9/2005 | Yang | H01L 21/76816 438/620 |
| 2007/0013076 A1* | 1/2007 | Akiyama | H01L 21/31058 257/758 |
| 2010/0013049 A1 | 1/2010 | Tanaka et al. | |
| 2010/0120212 A1* | 5/2010 | Yang | H01L 21/0337 438/239 |
| 2012/0273848 A1* | 11/2012 | Fan | H01L 21/823418 257/288 |
| 2013/0214364 A1 | 8/2013 | Jagannathan et al. | |
| 2013/0248990 A1 | 9/2013 | Kim et al. | |
| 2014/0001556 A1* | 1/2014 | Arai | H01L 29/7831 257/365 |
| 2014/0001574 A1 | 1/2014 | Chen et al. | |
| 2014/0110755 A1 | 4/2014 | Colinge | |
| 2014/0151812 A1 | 6/2014 | Liaw | |
| 2015/0145009 A1 | 5/2015 | Namioka | |
| 2015/0325453 A1 | 11/2015 | Lu et al. | |

* cited by examiner

METHOD OF FORMING TRENCHES WITH DIFFERENT DEPTHS

This patent claims priority to U.S. Provisional No. 62/313,472 filed Mar. 25, 2016, and U.S. Ser. No. 15/178,229 filed Jun. 9, 2016, the entire disclosures of which are incorporated herein by reference.

BACKGROUND

The semiconductor integrated circuit (IC) industry has experienced rapid growth. Technological advances in IC design and material have produced generations of ICs where each generation has smaller and more complex circuits than previous generations. In the course of IC evolution, functional density (i.e., the number of interconnected devices per chip area) has generally increased while geometry size (i.e., the smallest component (or line) that can be created using a fabrication process) has decreased.

This scaling down process generally provides benefits by increasing production efficiency and lowering associated costs. Such scaling down has also increased the complexity of IC processing and manufacturing. For these advances to be realized, similar developments in IC processing and manufacturing are needed. One area is the wiring, or interconnects, between the transistors and other devices. Although existing methods of fabricating IC devices have been generally adequate for their intended purposes, they have not been entirely satisfactory in all respects. For example, challenges arise in developing robust processes for forming trenches having various depths.

BRIEF DESCRIPTION OF THE DRAWINGS

Aspects of the present disclosure are best understood from the following detailed description when read in association with the accompanying figures. It is noted that, in accordance with the standard practice in the industry, various features in drawings are not drawn to scale. In fact, the dimensions of illustrated features may be arbitrarily increased or decreased for clarity of discussion.

DETAILED DESCRIPTION

Figure 1:
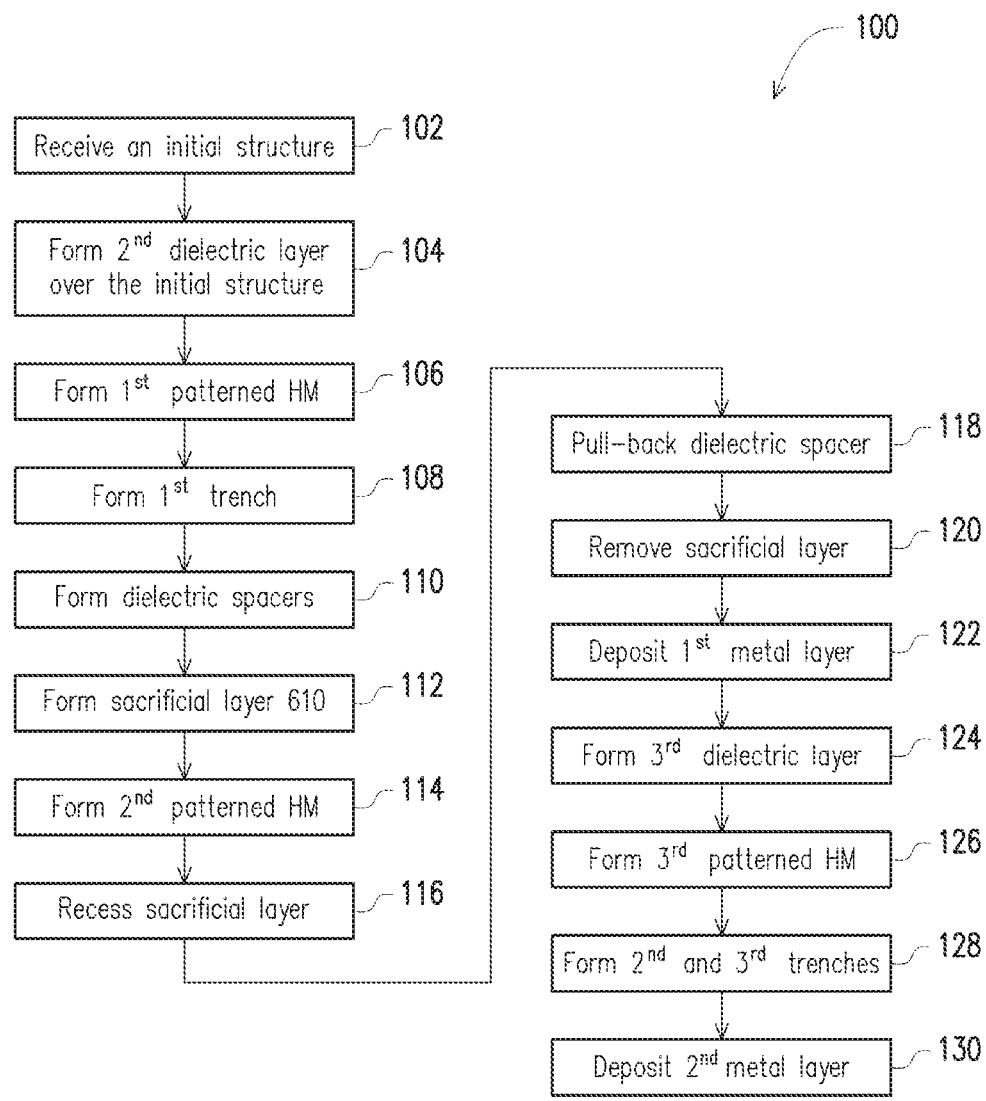
FIG. 1 is a flowchart of an example method for fabricating a semiconductor device constructed in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1 is a flowchart of a method 100 of fabricating one or more semiconductor device in accordance with some embodiments. The method 100 is an example, and is not intended to limit the present disclosure beyond what is explicitly recited in the claims. Additional operations can be provided before, during, and after the method 100, and some operations described can be replaced, eliminated, or relocated for additional embodiments of the method. The method 100 is discussed in detail below, with reference to an initial structure 205 of a semiconductor device 200 showed in FIG. 2 and the semiconductor device 200 shown in FIGS. 3 through 16.

As will be shown, the device 200 is a planar FET device. This does not necessarily limit the embodiments to any types of devices, any number of devices, any number of regions, or any configuration of structures or regions. For example, the provided subject matter can be applied in fabricating FinFET devices and other type of multi-gate FET devices. Furthermore, the device 200 may be an intermediate device fabricated during the processing of an IC, or a portion thereof, that may comprise static random access memory (SRAM) and/or other logic circuits, passive components such as resistors, capacitors, and inductors, and active components such as p-type FETs (PFETs), n-type FETs (NFETs), FinFETs, metal-oxide semiconductor field effect transistors (MOSFET), complementary metal-oxide semiconductor (CMOS) transistors, bipolar transistors, high voltage transistors, high frequency transistors, other memory cells, and combinations thereof.

Figure 2:
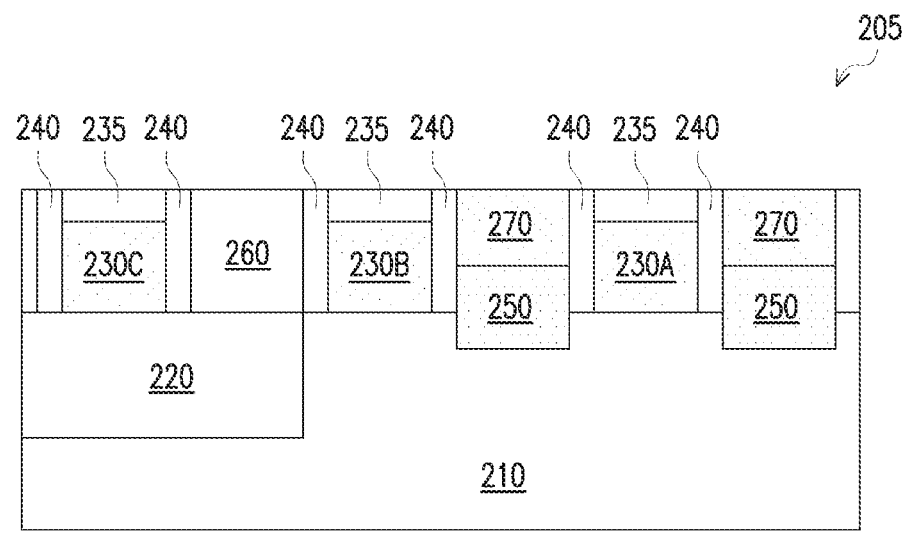
FIG. 2 is a cross-sectional view of an example initial structure in accordance with some embodiments.

Referring to FIGS. 1 and 2, method 100 starts at step 102 by receiving the initial structure 205 of the semiconductor device 200. The initial structure 205 includes a substrate 210. The substrate 210 may be a bulk silicon substrate. Alternatively, the substrate 210 may comprise an elementary semiconductor, such as silicon or germanium in a crystalline structure; a compound semiconductor, such as silicon germanium, silicon carbide, gallium arsenic, gallium phosphide, indium phosphide, indium arsenide, and/or indium antimonide; or combinations thereof. Possible substrates 210 also include a silicon-on-insulator (SOI) substrate. SOI substrates are fabricated using separation by implantation of oxygen (SIMOX), wafer bonding, and/or other suitable methods.

Some exemplary substrates 210 also include an insulator layer. The insulator layer comprises any suitable material, including silicon oxide, sapphire, and/or combinations thereof. An exemplary insulator layer may be a buried oxide layer (BOX). The insulator is formed by any suitable process, such as implantation (e.g., SIMOX), oxidation, deposition, and/or other suitable process. In some exemplary substrate 210, the insulator layer is a component (e.g., layer) of a silicon-on-insulator substrate.

The substrate 210 may also include various doped regions. The doped regions may be doped with p-type dopants, such as boron or $BF_2$; n-type dopants, such as phosphorus or arsenic; or combinations thereof. The doped regions may be formed directly on the substrate 210, in a P-well structure, in an N-well structure, in a dual-well structure, or using a raised structure. The substrate 210 may further include various active regions, such as regions configured for an N-type metal-oxide-semiconductor transistor device and regions configured for a P-type metal-oxide-semiconductor transistor device.

The substrate 210 may also include various isolation features 220. The isolation features 220 separate various device regions in the substrate 210. The isolation features 220 include different structures formed by using different processing technologies. For example, the isolation features 220 may include shallow trench isolation (STI) features. The formation of a STI may include etching a trench in the substrate 210 and filling in the trench with insulator materials such as silicon oxide, silicon nitride, or silicon oxynitride. The filled trench may have a multi-layer structure such as a thermal oxide liner layer with silicon nitride filling the trench. A chemical mechanical polishing (CMP) may be performed to polish back excessive insulator materials and planarize the top surface of the isolation features 220.

The initial structure 205 also includes a plurality of first conductive features, 230A, 230B and 230C, over the substrate 210. In some embodiments, the first conductive features, 230A, 230B and 230C, may be gate structures including high-k/metal gate stacks (HK/MGs). Alternatively, in some embodiment, the first conductive features, 230A, 230B and 230C, may also include a portion of the interconnect structure, such as a contact, a metal via, and/or metal line. In one embodiment, the first conductive features 230A, 230B and 230C, include electrodes, capacitors, resistors and/or a portion of a resistor. For the purpose of simplicity and clarity, the first conductive features, 230A, 230B and 230C, are referred to as the HK/MGs, 230A, 230B and 230C.

The HK/MGs, 230A, 230B and 230C, may include interfacial layers, gate dielectric layers, work function metal layers and fill layers. The interfacial layers may include a dielectric material such as silicon oxide or silicon oxynitride, and may be formed by chemical oxidation, thermal oxidation, ALD, CVD, and/or other suitable dielectric. The gate dielectric layer may include a high-k dielectric layer such as hafnium oxide ($HfO_2$), zirconium oxide ($ZrO_2$), lanthanum oxide ($La_2O_3$), titanium oxide ($TiO_2$), yttrium oxide ($Y_2O_3$), strontium titanate ($SrTiO_3$), other suitable metal-oxides, or combinations thereof. The gate dielectric layers may be formed by ALD and/or other suitable methods. The work function metal layers may be an n-type work function layer for NFETs or a p-type work function layer for PFETs, and may be deposited by CVD, PVD, and/or other suitable process. The p-type work function layer comprises a metal with a sufficiently large effective work function, selected from but not limited to the group of titanium nitride (TiN), tantalum nitride (TaN), ruthenium (Ru), molybdenum (Mo), tungsten (W), platinum (Pt), or combinations thereof. The n-type work function layer comprises a metal with sufficiently low effective work function, selected from but not limited to the group of titanium (Ti), aluminum (Al), tantalum carbide (TaC), tantalum carbide nitride (TaCN), tantalum silicon nitride (TaSiN), or combinations thereof. The fill layers may include aluminum (Al), tungsten (W), or copper (Cu) and/or other suitable materials, and may be formed by CVD, PVD, plating, and/or other suitable processes. A CMP process may be performed to remove excess materials from the HK/MG stacks, 230A, 230B and 230C, and to planarize a top surface of the initial structure 205.

In some embodiment, dummy gate stacks are formed first and then are replaced later by HK/MGs, 230A, 230B and 230C, after high thermal temperature processes are performed, such as thermal processes during sources/drains formation. The dummy gate stack may include a dummy gate dielectric layer and a polysilicon layer and may be formed by deposition, patterning and etching processes.

In some embodiments, a gate hard mask (GHM) 235 is formed on top of each of the HK/MGs, 230A, 230B and 230C. The GHM 235 may include titanium (Ti), titanium oxide, TiN, TiSiN, tantalum (Ta), tantalum oxide, TaN, TaSiN, silicon nitride, silicon oxide, silicon carbide, silicon carbide nitride, manganese (Mn), cobalt (Co), ruthenium (Ru), WN, aluminum nitride, aluminum oxide, and/or other suitable material. The GHM 235 may be formed by deposition, lithography patterning and etch processes.

In some embodiments, gate spacers 240 may be formed along the sidewalls of the HK/MGs, 230A, 230B and 230C. The gate spacers 240 may include a dielectric material such as silicon nitride. Alternatively, the gate spacers 240 may include silicon carbide, silicon oxynitride, and/or other suitable material. The gate spacers 240 may be formed by depositing a gate spacer layer and then anisotropic dry etching the gate spacer layer.

The initial structure 205 may also include second conductive features 250 over the substrate 210. A top surface of the second conductive feature 250 may not be at same horizontal level as the HK/MG stacks, 230A, 230B and 230C. For example, the top surface of the second conductive feature 250 is substantial below the top surface of the HK/MG stacks, 230A, 230B and 230C. The second conductive feature 250 may be formed by processes such as deposition, photolithography and etch. In some embodiments, the second conductive features 250 are source/drain (S/D) features, beside and separated by the HK/MG 230A. Alternatively, in some embodiment, the second conductive feature 250 may also include a portion of the interconnect structure, such as a contact, metal via, or metal line. In one embodiment, the second conductive features 250 include electrodes, capacitors, resistors or a portion of a resistor. For the purpose of simplicity and clarity, the second conductive feature 250 is referred to as the S/D feature 250 hereinafter.

Here, one of the S/D features 250 is a source feature and another of the S/D features 250 is a drain feature. In one embodiment, a portion of the substrate 210, beside the HK/MG 230A is recessed to form S/D recesses and then the S/D features 250 are formed over the S/D recesses by epitaxial growing processes, such as CVD, VPE and/or UHV-CVD, molecular beam epitaxy, and/or other suitable processes. The S/D features 250 may include germanium (Ge), silicon (Si), gallium arsenide (GaAs), aluminum gallium arsenide (AlGaAs), silicon germanium (SiGe), gallium arsenide phosphide (GaAsP), gallium antimony (GaSb), indium antimony (InSb), indium gallium arsenide (InGaAs), indium arsenide (InAs), or other suitable materials. The S/D features 250 may be formed by epitaxial growing processes, such as CVD deposition techniques (e.g., vapor-phase epitaxy (VPE) and/or ultra-high vacuum CVD (UHV-CVD)), molecular beam epitaxy, and/or other suitable processes. The S/D features 250 may be in-situ doped during the epi processes. Alternatively, when the S/D feature 250 is not in-situ doped, an implantation process (i.e., a junction implant process) is performed to dope the S/D feature 250. One or more annealing processes may be performed to activate dopants.

In the present embodiment, the initial structure 205 includes a first dielectric layer 260 deposited over the substrate 210, including fully filling in spaces between the HK/MGs 230B and 230C. The first dielectric layer 260 may include tetraethylorthosilicate (TEOS) oxide, un-doped silicate glass, or doped silicon oxide such as borophosphosilicate glass (BPSG), fused silica glass (FSG), phosphosilicate glass (PSG), boron doped silicon glass (BSG), and/or other suitable dielectric materials. The first dielectric layer 260 may also include a dielectric material having a dielectric constant (k) lower than thermal silicon oxide (therefore referred to as low-k dielectric material layer). The low-k dielectric material may include carbon containing materials, organo-silicate (OSG) glass, porogen-containing materials, a hydrogen silsesquioxane (HSQ) dielectric material, a methylsilsesquioxane (MSQ) dielectric material, a carbon doped oxide (CDO) dielectric material, a hydrogenated silicon oxy-carbide (SiCOH) dielectric material, a benzocyclobutene (BCB) dielectric material, an arylcyclobutene based dielectric material, a polyphenylene based dielectric material, other suitable materials, and/or a combination thereof. The first dielectric layer 260 may include a single layer or multiple layers. The first dielectric layer 260 may be deposited by CVD, ALD, spin-on coating, and/or other suitable techniques.

The initial structure 205 may also include third conductive features 270 over respective S/D features 250. In the present embodiment, the third conductive features 270 are S/D contact metals. As shown, the S/D contact metals 270 extend to the respective S/D features 250. The S/D contact metal 270 may include copper (Cu), aluminum (Al), tungsten (W), copper, copper magnesium (CuMn), copper aluminum (CuAl) or copper silicon (CuSi), and/or other suitable conductive material. The formation of the S/D contact metals 270 may include forming trenches and filling the trenches with a metal layer; and performing a chemical mechanical polishing (CMP) process to planarize the top surface and remove the excessive metal layer.

Figure 3:
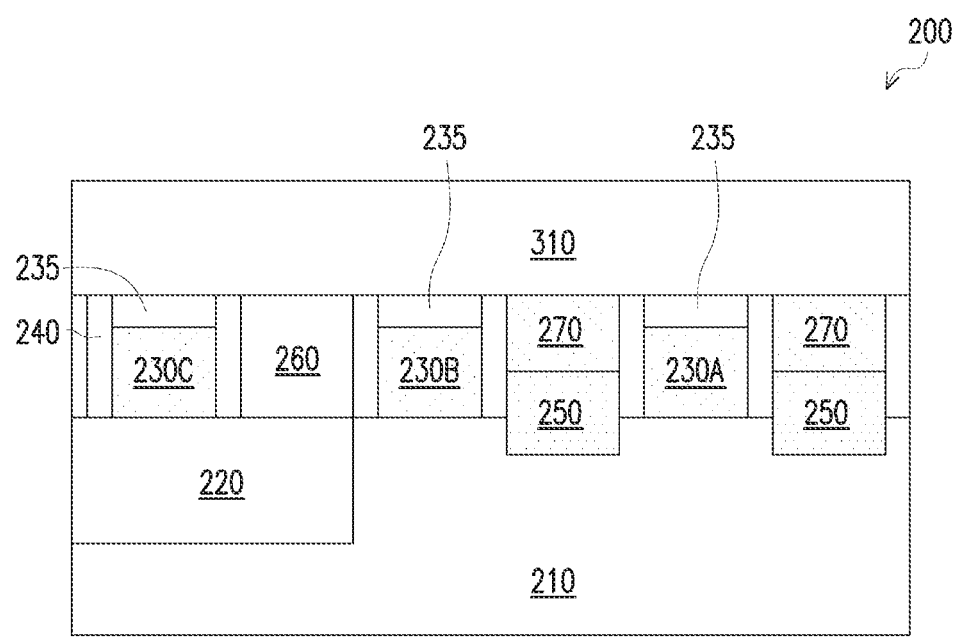
FIGS. 3, 4, 5, 6A, 6B, 7, 8, 9, 10A, 10B, 11, 12, 13, 14A, 14B, 15A, 15B and 16 are cross-sectional views of an example semiconductor device in accordance with some embodiments.

Referring to FIGS. 1 and 3, once the initial structure 205 is received, method 100 proceeds to step 104 by forming a second dielectric layer 310 over the initial structure 205, including over the HK/MG stacks, 230A, 230B and 230C, the first dielectric layer 260 and the S/D contact metals 270. The second dielectric layer 310 is formed similarly in many respects to the first dielectric layer 260 discussed above in association with FIG. 2, including the materials discussed therein.

Typically, one or more film layers may be formed over the second dielectric layer 310 and then trenches are formed to reach respective features locating at different horizontal levels (depths) of film layers. In order to achieve process simplicity and cost reduction, it is desired to form trenches having different depths during the same etching process (i.e. at the same time). In order to do so, it is needed that when a first trench has reached a designated depth/feature while a second trench has not, the etching process stops in the first trench while the etching process continues to extend the second trench further. However, challenges arise in stopping the etching in the first trench while continuing the etching in the second trench. The present disclosure provides a method to form a first trench having a first depth (i.e. a shallow trench) and a second trench having a second depth (i.e. a deep trench) during the same etching process while avoiding the continuing etching of the first trench during the necessary continuing etching of the second trench.

Figure 4:
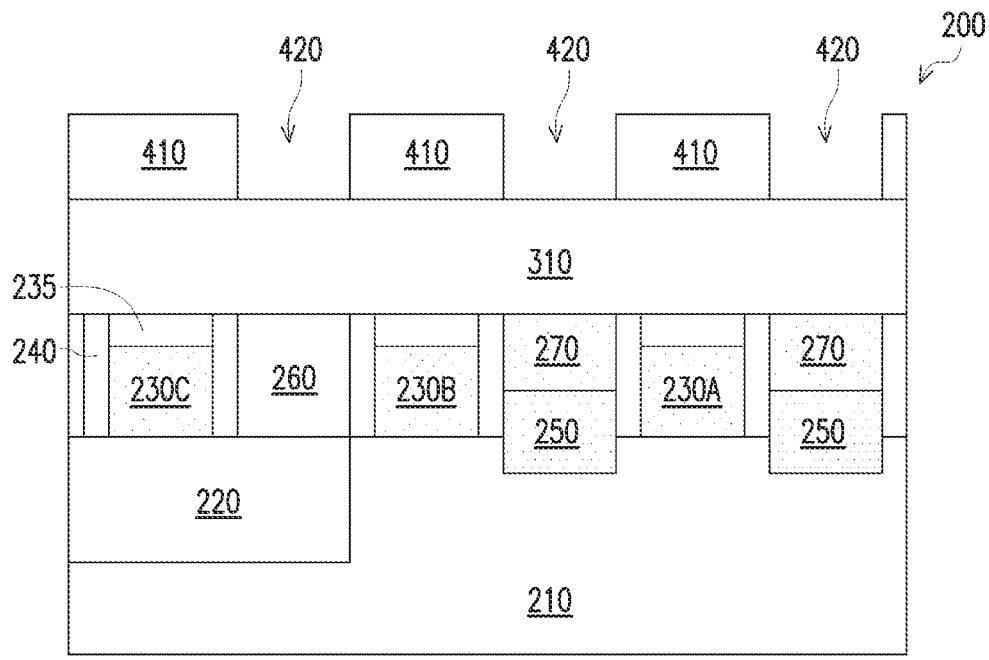

Referring to FIGS. 1 and 4, method 100 proceeds to step 106 by forming a first patterned HM 410 having a plurality of first openings 420 over the second dielectric layer 310. The first openings 420 define regions for trenches to be formed thereon. In the present embodiment, the first openings 420 align to respective contact metals 270 and a portion of the first dielectric layer 260 between the HK/MG 230B and the HK/MG 230C.

In some embodiments, the first patterned HM 410 is a patterned photoresist layer and formed by a by a lithography process. An exemplary lithography process may include forming a photoresist layer, exposing the photoresist layer by a lithography exposure process, performing a post-exposure bake process, and developing the photoresist layer to form the patterned resist layer. Alternatively, the first patterned HM 410 may be formed by depositing a HM layer, forming a patterned photoresist layer over the HM layer by a lithography process and etching the HM material layer through the patterned photoresist layer to form the first patterned HM 410.

Figure 5:
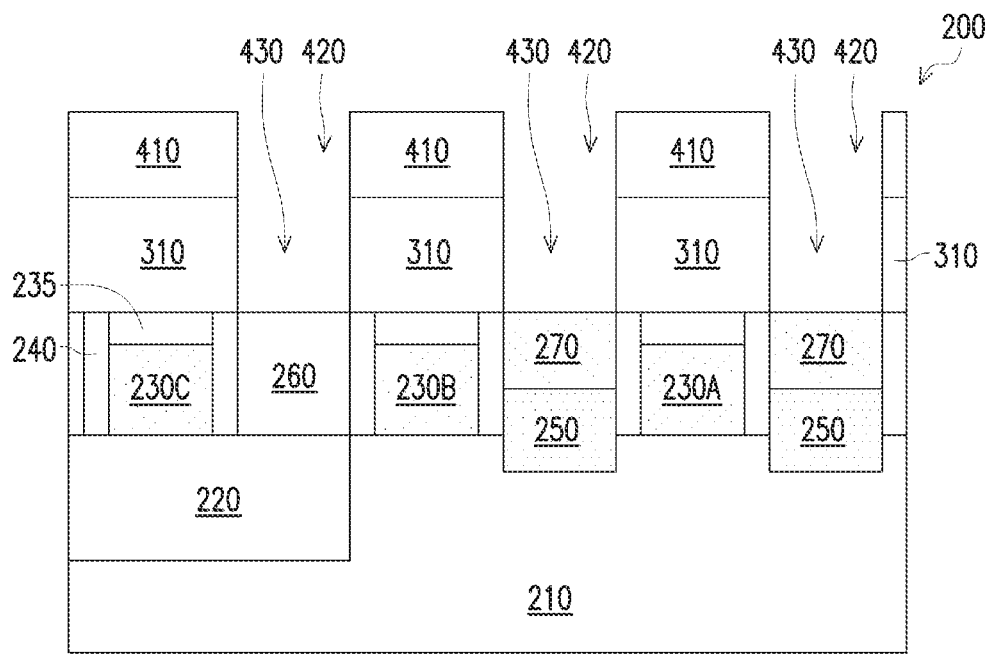

Referring to FIGS. 1 and 5, method 100 proceeds to step 108 by etching the second dielectric layer 310 through the first openings 420 to form first trenches 430 in the second dielectric layer 310. In other words, portions of the second dielectric layer 310 define the first trenches 430. In an embodiment, each of the first trenches 430 is formed with a vertical profile. In another embodiment, each of the first trenches 430 is formed with taper profile. In some embodiments, the S/D contact features 270 and a portion of the first dielectric layer 260 are exposed in the respective first trenches 430. The trench etch may include a wet etch, a dry etch, and/or a combination thereof. As an example, the trench etch includes a plasma dry etching process using a fluorine-based chemistry, such as $CF_4$, $SF_6$, $CH_2F_2$, $CHF_3$, and/or $C_2F_6$. As another example, a wet etching process may comprise etching in diluted hydrofluoric acid (DHF); potassium hydroxide (KOH) solution; ammonia; a solution containing hydrofluoric acid (HF), nitric acid ($HNO_3$), and/or acetic acid ($CH_3COOH$); and/or other suitable wet etchant.

After forming the first trenches 430, the first patterned HM 410 is removed by another etch process. In one example where the first patterned HM 410 is a photoresist pattern, the first patterned HM 410 is removed by wet stripping and/or plasma ashing.

Figure 6A:
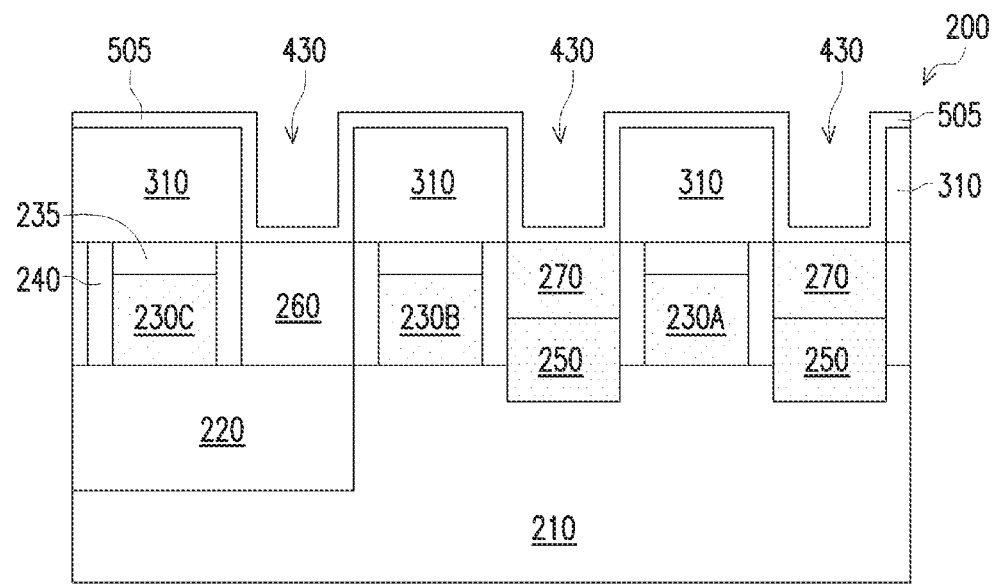
Figure 6B:
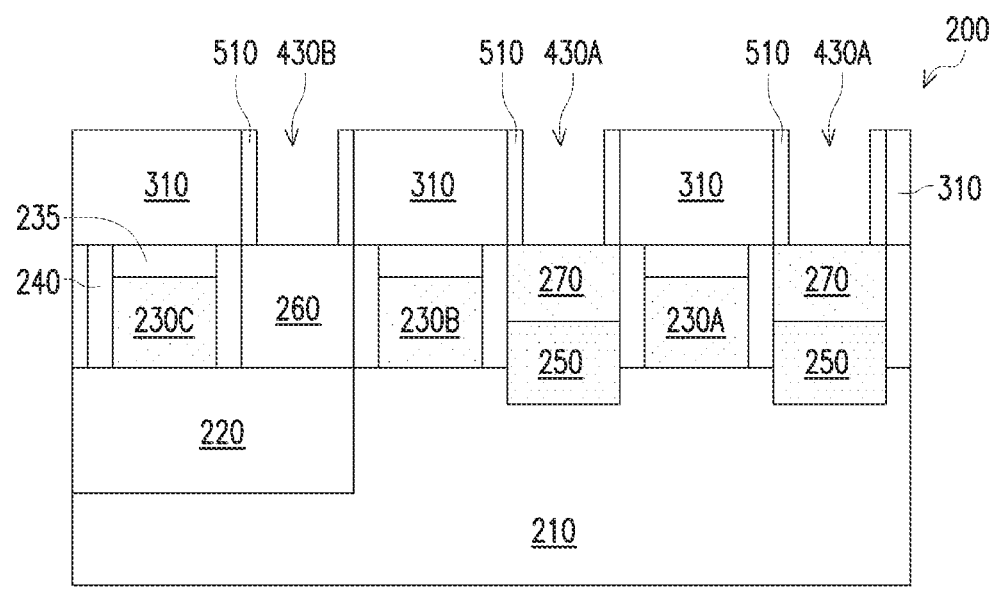

Referring to FIGS. 1, 6A and 6B, method 100 proceeds to step 110 by forming dielectric spacers 510 along sidewalls of the first trenches 430. In some embodiment, the dielectric spacers 510 are formed by depositing a dielectric spacer layer 505 along sidewalls of the first trenches 430, as shown in FIG. 6A and then etching the dielectric spacer layer 505 by an anisotropic dry etching process to form dielectric spacers 510, as shown in FIG. 6B. In some embodiments, the dielectric spacer layer 505 may include silicon oxide, silicon nitride, silicon oxynitride, silicon carbon nitride, a low-k nitride, and/or a combination thereof. The dielectric spacer layer 505 may include multiple films, such as a silicon oxide film and a silicon nitride film. The formation of the dielectric spacers 510 may include deposition and anisotropic etching. In some examples, the deposition may include CVD, ALD, and/or other suitable methods. In some examples, the anisotropic etch may include a dry etch, such as a plasma etch with a bias and a suitable etchant, such as $CF_4$, $SF_6$, $NF_3$, $CH_2F_2$, and/or a combination thereof. the etching process, the dielectric spacer layer 505 at the bottom of the first trenches 430 is removed as well. As a result, portions of the S/D contact metal 270 are exposed within a first subset of first trenches 430, referred to as a first subset trench 430A, and a portion of the first dielectric layer 260 is exposed within another subset of the first trenches 430, referred to as a second subset trenches 430B.

Figure 7:
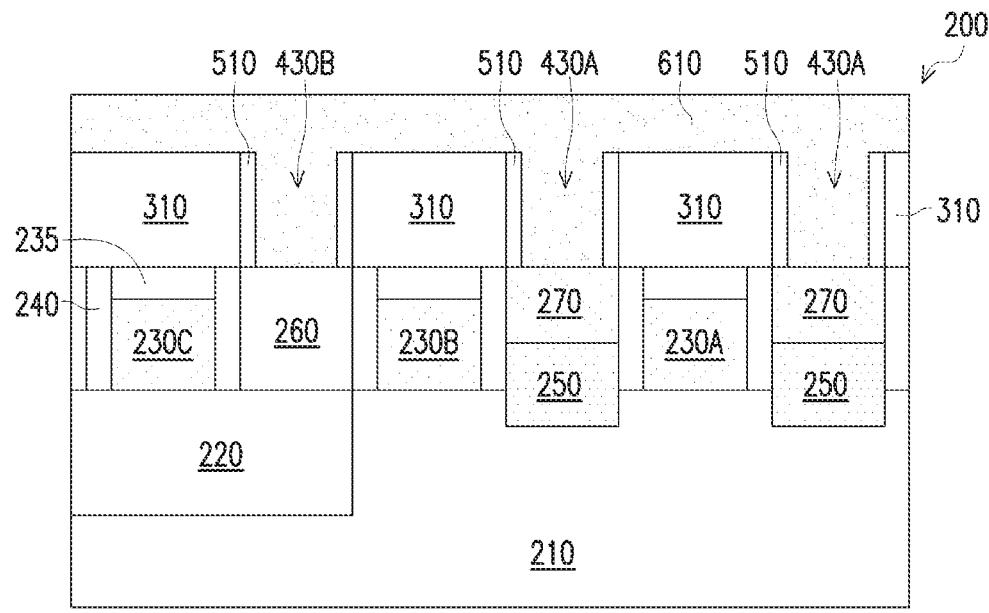

Referring to FIGS. 1 and 7, method 100 proceeds to step 112 by forming a sacrificial layer 610 over the substrate 210, including filling in the first and second subset trenches, 430A and 430B. The sacrificial layer 610 may include spin-on glass, silicon oxide, silicon nitride, oxynitride, silicon carbide, and/or other suitable materials. In some embodiments, the sacrificial layer 610 includes a material which is different from the dielectric spacers 510, the second dielectric layer 310 and the first dielectric layer 260 to achieve etching selectivity in subsequent etches. The sacrificial layer 610 may be deposited by CVD, PVD, ALD, spin-on coating, or other suitable techniques. Additionally, a CMP may be performed to polish back the excessive sacrificial layer 610 and planarize the top surface of the sacrificial layer 610.

Figure 8:
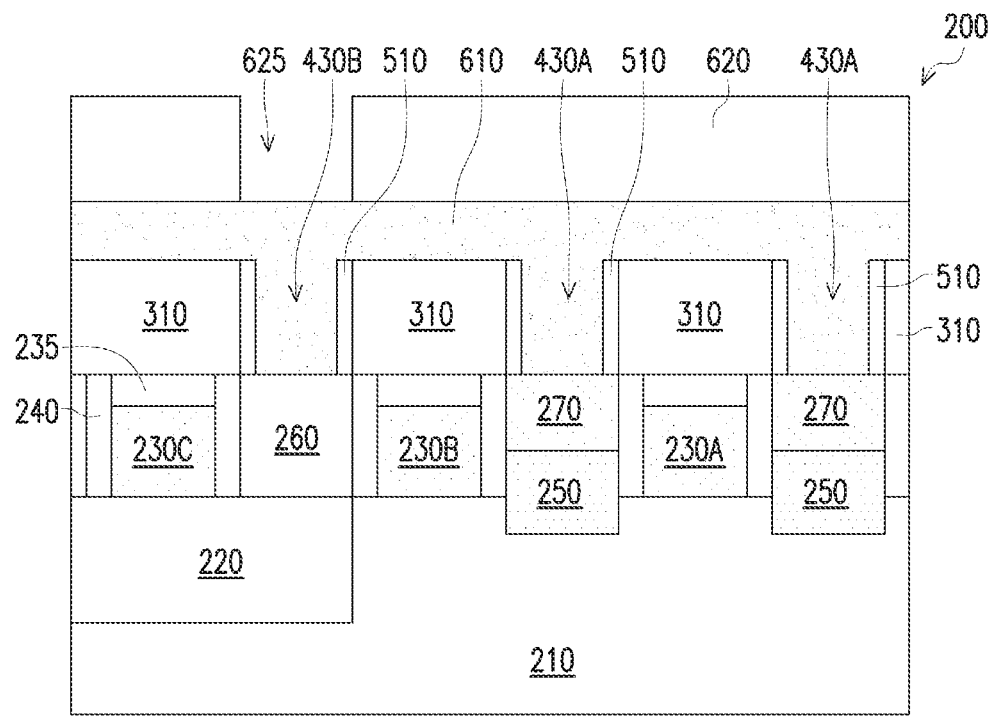

Referring to FIGS. 1 and 8, method 100 proceeds to step 114 by forming a second patterned HM 620 over the sacrificial layer 610. In the present embodiment, the second patterned HM 620 has a second opening 625 aligning with the second subset trenches 430B. The second patterned HM 620 is formed similarly with many respects to the first patterned HM 410 discussed above association with FIG. 4, including materials discussed therein.

Figure 9:
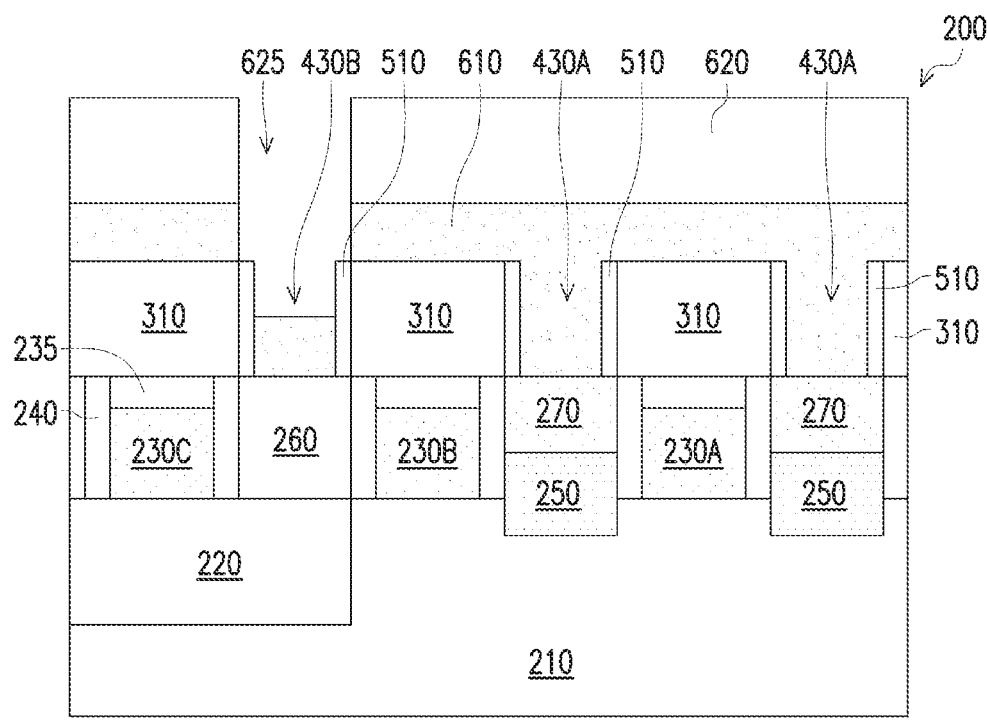

Referring to FIGS. 1 and 9, method 100 proceeds to step 116 by recessing the sacrificial layer 610 through the second opening 625 to expose top portions of the dielectric spacers 510 along sidewalls of the second subset trenches 430B while the sacrificial layer 610 in first subset trenches 430A is covered by the second patterned HM 620. The etch process may include a wet etch, a dry etch, and/or a combination thereof. As an example, a dry etching process may implement fluorine-containing gas (e.g., $CF_4$, $SF_6$, $CH_2F_2$, $CHF_3$, and/or $C_2F_6$), other suitable gases and/or plasmas, and/or combinations thereof. In some embodiments, the etch process is chosen to selectively etch the sacrificial layer 610 without etching the dielectric spacers 510. In the present embodiment, the sacrificial layer 610 in the second subset trench 430B is recessed such that a portion of the sacrificial layer 610 remains.

Figure 10A:
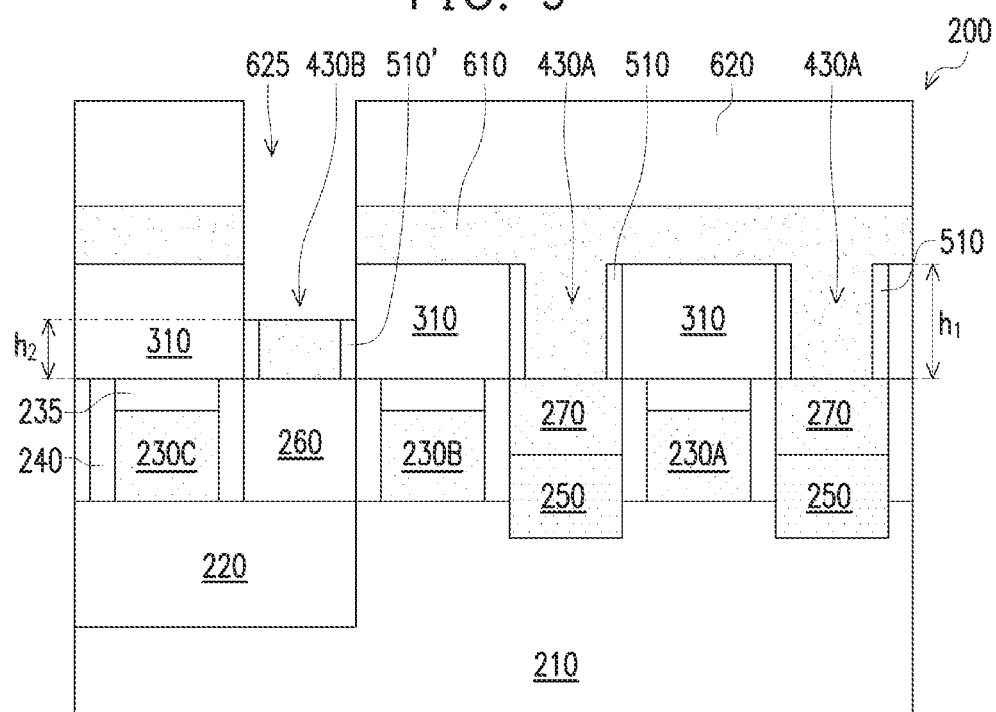

Referring to FIGS. 1 and 10A, method 100 proceeds to step 118 by recessing (pulling-back) the dielectric spacers 510 in the second subset trench 430B while the sacrificial layer 610 in the first subset trenches 430A is covered by the second patterned HM 610. The recessed dielectric spacers 510 are identified by reference numeral 510'. Therefore, the dielectric spacers 510 have a first height $h_1$ and the recessed dielectric spacers 510' have a second height $h_2$, which is smaller than the first height $h_1$. The etch process may include a wet etch, a dry etch, and/or a combination thereof. In the present embodiments, the etch process is chosen to selectively etch the dielectric spacers 510 without substantially etching the remaining sacrificial layer 610. In an embodiment, top surfaces of the recessed dielectric spacers 510' are co-planar with a top surface of the remaining sacrificial layer 610 within the second subset trench 430B.

Figure 10B:
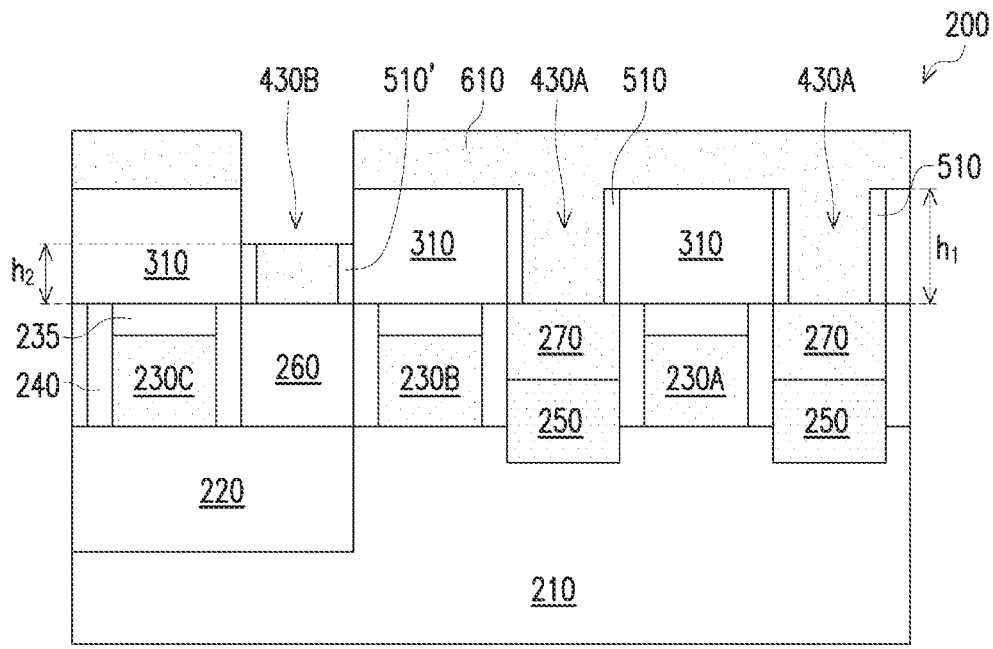

After recessing the dielectric spacers 510 in the second subset trench 430B, the second pattered HM 620 is removed by a proper etch process. In one example where the second patterned HM 620 is a resist pattern, the second patterned HM 620 is removed thereafter by wet stripping and/or plasma ashing, as shown in FIG. 10B.

Figure 11:
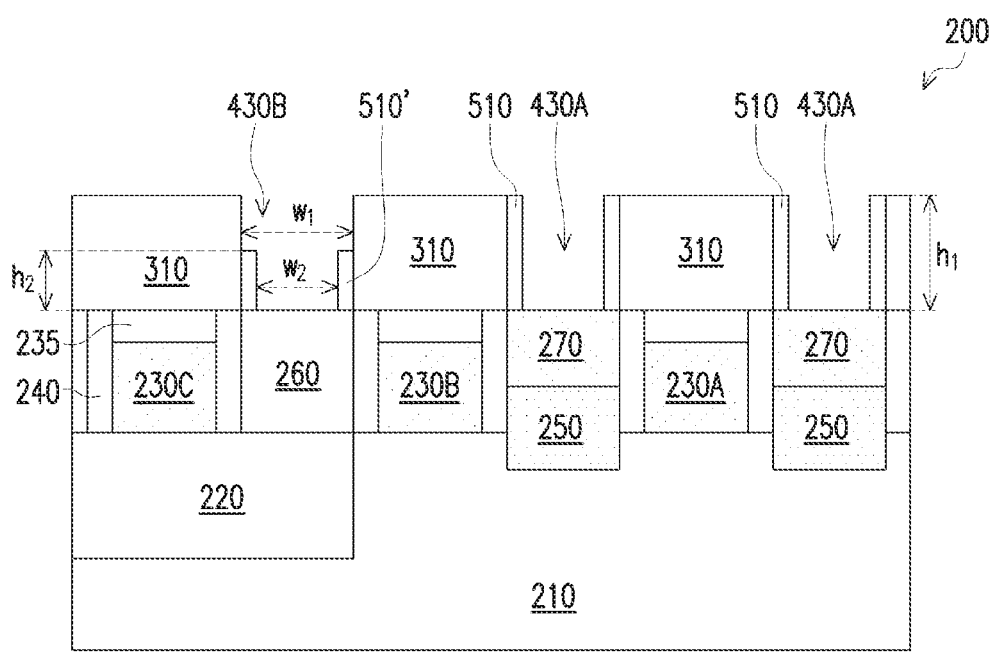

Referring to FIGS. 1 and 11, method 100 proceeds to step 120 by removing the sacrificial layer 610 from first and second subset trenches, 430A and 430B. The etch process may include a wet etch, a dry etch, and/or a combination thereof. In the present embodiment, the etch process is chosen to selectively etch sacrificial layer 610 without substantially etching the dielectric spacers 510 and 510', the first dielectric layer 260 and the S/D contact metal 270. As a result, in the first subset trenches 430A, the dielectric spacers 510 are disposed along the entire length of the sidewalls (i.e. defined by portions of second dielectric layer 310), while in the second subset trench 430B, the recessed dielectric spacers 510' are disposed along lower portions and absent along upper portions of sidewalls (i.e. defined by portions of second dielectric layer 310). In the present embodiment, the second subset trench 430B has a first width $w_1$ in its upper portion and a second width $w_2$ in its lower portion, which is smaller than the first width $w_1$.

Figure 12:
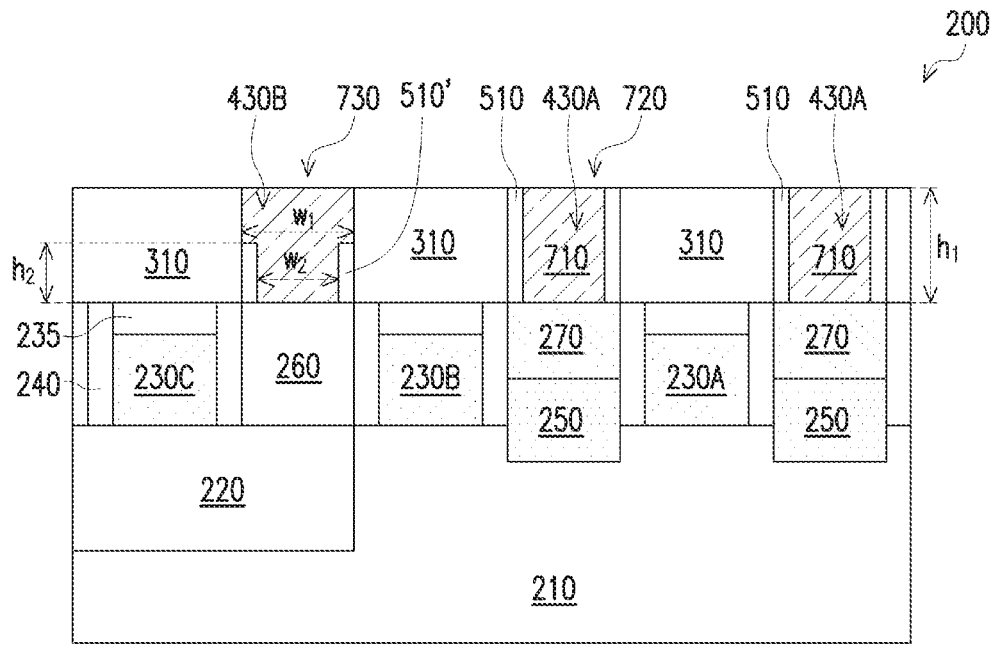

Referring to FIGS. 1 and 12, method 100 proceeds to step 122 by depositing a first metal layer 710 in the first and second subset trenches, 430A and 430B. In some embodiments, prior to depositing the first metal layer 710, a glue layer is deposited in the first and second subset trenches, 430A and 430B, to enhance material adhesion. The glue layer may include titanium nitride (TiN), tantalum nitride (TaN), tungsten nitride (WN), titanium silicon nitride (TiSiN) or tantalum silicon nitride (TaSiN). The first metal layer 710 may include copper (Cu), aluminum (Al), tungsten (W), copper, copper magnesium (CuMn), copper aluminum (CuAl) or copper silicon (CuSi), or other suitable conductive material. In an embodiment, the first metal layer 710 includes W. The glue layer and the first metal layer 710 may be deposited by PVD, CVD, metal-organic chemical vapor deposition (MOCVD), or plating. In some embodiments, a CMP process is performed to remove excessive first metal layer 710. The remaining first metal layer 710 in the first and second subset trenches, 430A and 430B, forms first and second metal features, 720 and 730, respectively.

As a result, the first metal feature 720 has the dielectric spacers 510 along its sidewalls while the second metal feature 730 has the recessed dielectric spacers 510' along a lower portion of its sidewalls and a portion of the second dielectric layer 310 define an upper portion of its sidewalls. As shown, an upper portion of the second metal feature 730 is on top of the recessed dielectric spacers 510'. Thus, the second metal feature 730 has the first width $w_1$ in its upper portion and the second width $w_2$ in its lower portion while the first metal feature 720 has a uniform width.

In the present embodiment, dielectric spacers, 510 and 510', enhance electric insulation between respective first and second metal features (720 and 730) and the HK/MG stacks (230A and 230B). In some embodiments, the first and second metal features, 720 and 730, provide vertical and horizontal electrical routing. For example, the first metal features 720 electrically connect with the S/D feature 250 through the S/D contact metal 270 while the second metal feature 730 provides a metal line for horizontal electrical routine.

Figure 13:
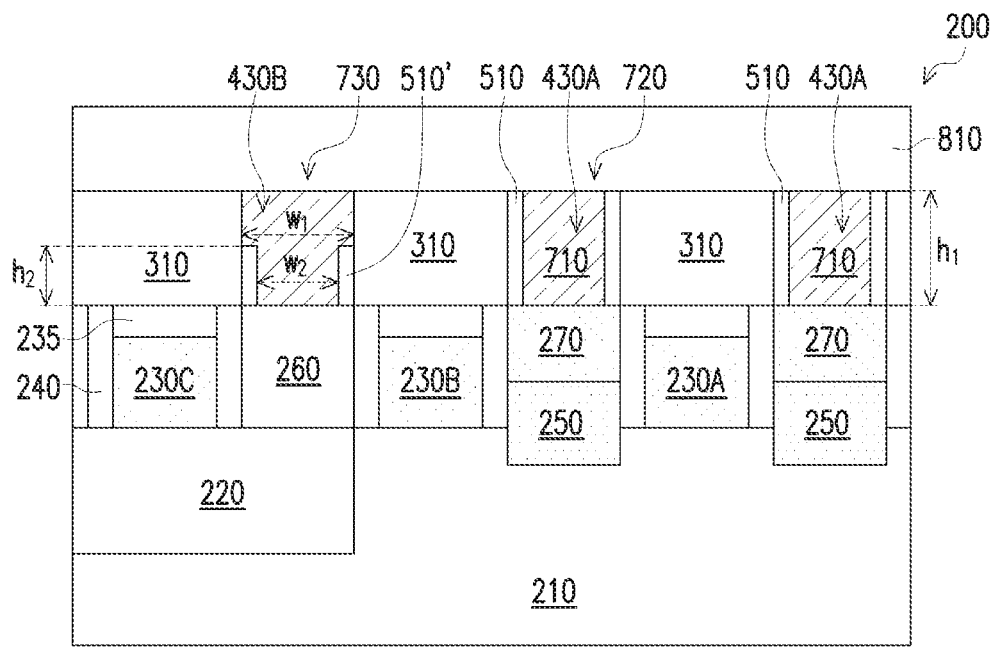

Referring to FIGS. 1 and 13, method 100 proceeds to step 124 by forming a third dielectric layer 810 over the second dielectric layer 310 and the first and second metal features, 720 and 730. The third dielectric layer 810 is formed similarly in many respects to the first dielectric layer 260 discussed above in association with FIG. 2, including the materials discussed therein.

Figure 14A:
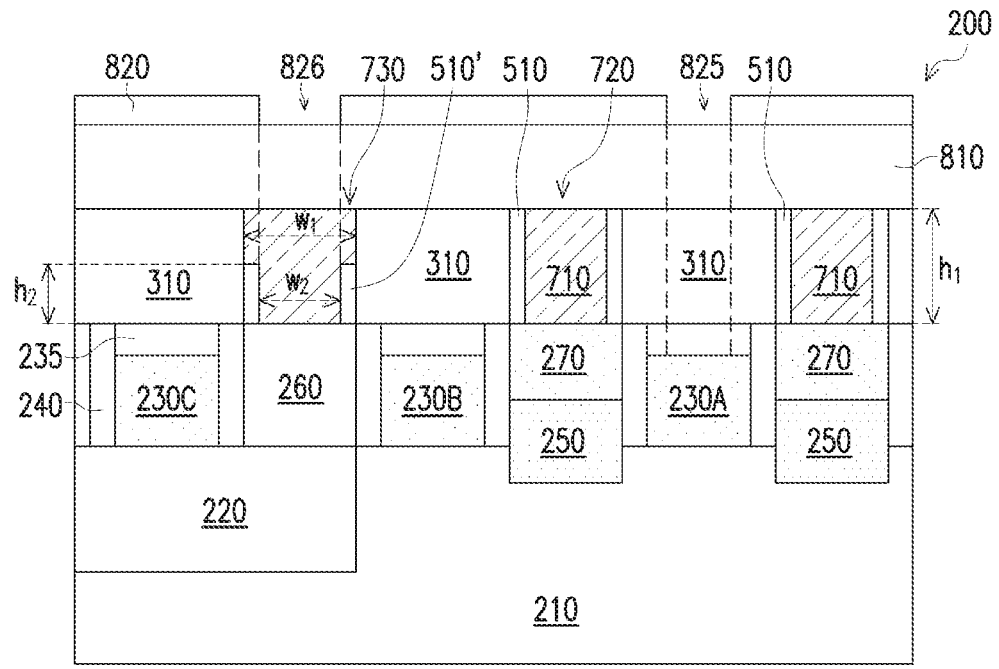

Referring to FIGS. 1 and 14A, method 100 proceeds to step 126 by forming a third patterned HM 820 over the third dielectric layer 810. In the present embodiment, the third patterned HM 820 has a third opening 825 aligned with the HM/MG stack 230A and a fourth opening 826 aligned with the second metal feature 730. The third patterned HM 820 is formed similarly with many respects to the first patterned HM 410 discussed above in association with FIG. 4, including materials discussed therein.

Figure 14B:
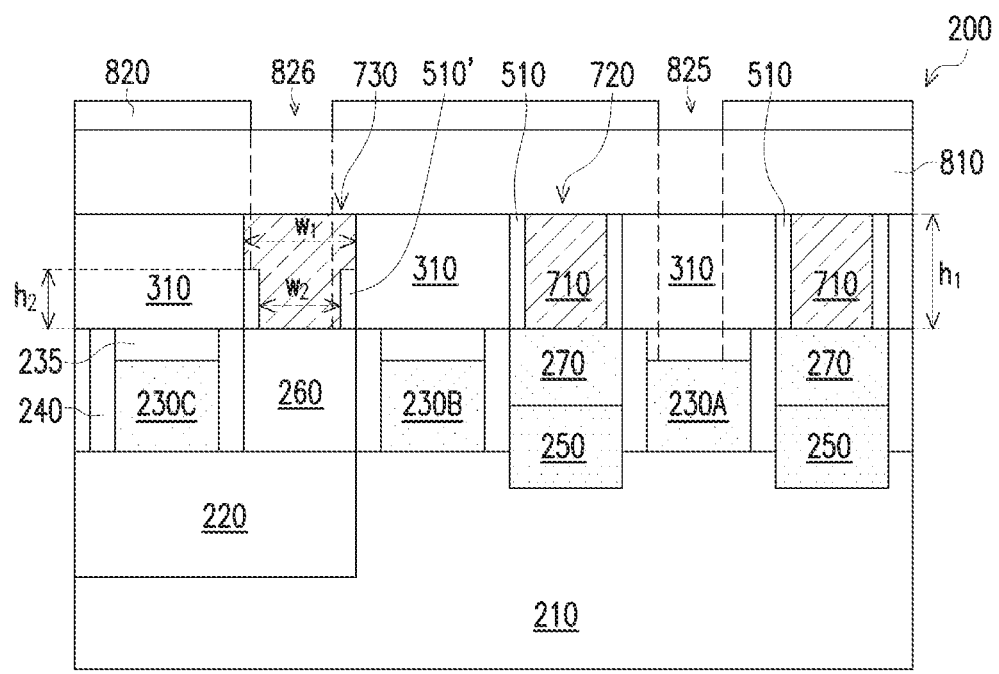

In the present embodiment, with the wider upper width (first width $w_1$) of the second metal feature 730, an off-center alignment of the fourth opening 826 to the second metal feature 730 (such as it aligns to one side of the dielectric spacer 510', as shown in FIG. 14B), becomes tolerable. This provides advantages, such as relaxing lithography process resolution constrains and enlarging a process window in the patterning process of forming the fourth opening 826, especially when the device 200 scales down such that widths of the first and second metal features, 720 and 730, become smaller and smaller.

Figure 15A:
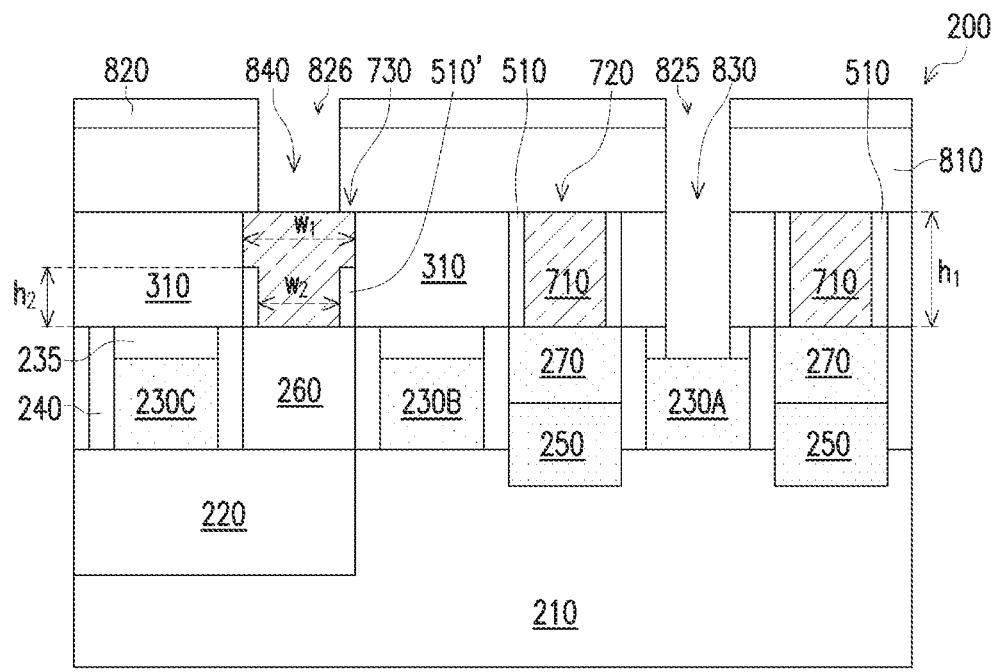

Referring to FIGS. 1 and 15A, method 100 proceeds to step 128 by etching the third dielectric layer 810, the second dielectric layer 310 and the GHM 235 through the third opening 825 to form a second trench 830 and etching the third dielectric layer 810 through the fourth opening 826 to form a third trench 840. As shown in FIG. 15A, the second trench 830 (which extends through both of the third dielectric layers 810, the second dielectric layer 310 and the GHM 235) is deeper than the third trench 840 (which extends through the third dielectric layer 810).

As has been mentioned previously, it is desired to form the second trench 830 and the third trench 840 at the same etching process, or in other words, at same time. In order to achieve this, the second metal feature 730 serves as an etch-stop-layer to prevent the third trench 840 from being etched further while the second trench 830 is continually extended through the second dielectric layer 310 and the GHM 235 to reach the HK/MG stack 230A. The etch process may include a selective wet etch, a selective dry etch, and/or a combination thereof. Since a metal layer (such as the second metal feature 730) usually withstand well in a dielectric etching process (such as etching the second dielectric layer 310 and the GHM 235), etching process constrains of choosing etchant for an adequate selectivity is relaxed and etching process flexibility is obtained. In an embodiment, the dry etching process includes using fluorine-containing gas (e.g., $CF_4$, $SF_6$, $CH_2F_2$, $CHF_3$, and/or $C_2F_6$).

Figure 15B:
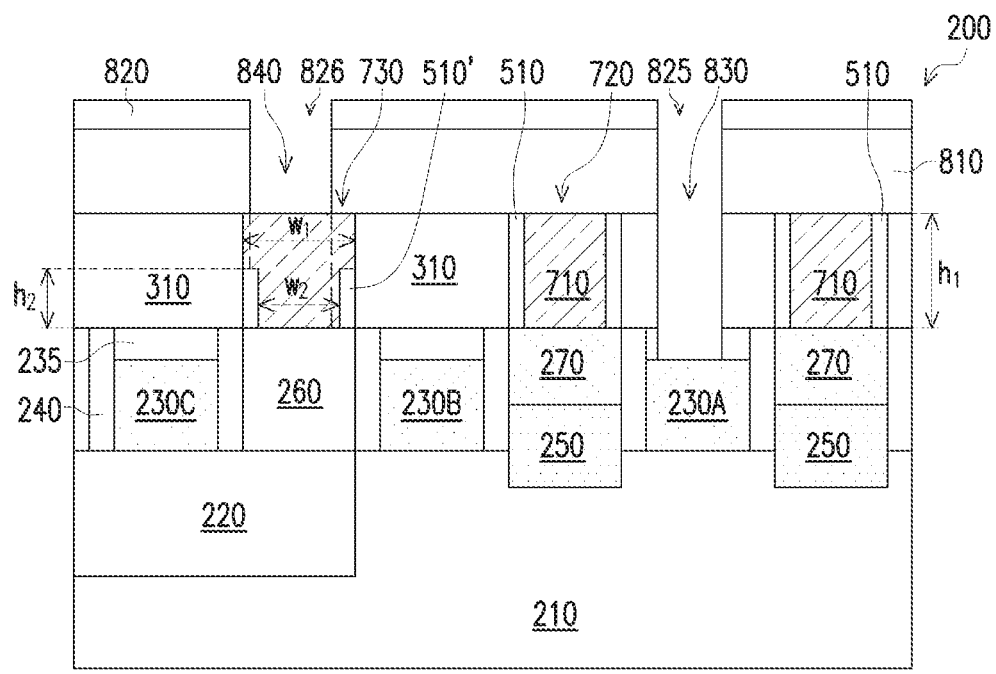

Referring to FIG. 15B, for circumstances where the fourth opening 826 has an off-center alignment to the second metal feature 730, such as it aligns with one side of the recessed dielectric spacer 510' (as shown in FIG. 14B), the upper portion of the second metal feature 740 with the wider width (namely the first width $w_1$) protects the recessed dielectric spacers 510' from being etched during the second trench 830 being extended to the HK/MG stacks 230A. Since it is quite common in device fabrication that the recessed dielectric spacer 510', the second dielectric layer 310 and the GHM 235 are all formed by dielectric materials, it is challenge to have etching processes with adequate etch selectivity among dielectric materials, especially when forming two different trenches with two different depths at the same time. As has been mentioned above, in the present embodiment, a metal layer (such as the second metal feature 730) servers as an ESL, thereby an adequate etch selectivity is obtained and adverse etch-through at the recessed dielectric spacer 510' is prevented.

After forming the second and third trenches, 830 and 840, the third pattered HM 820 is removed by a proper etch process. In one example where the third patterned HM 820 is a resist pattern, the third patterned HM 820 is removed thereafter by wet stripping and/or plasma ashing.

Figure 16:
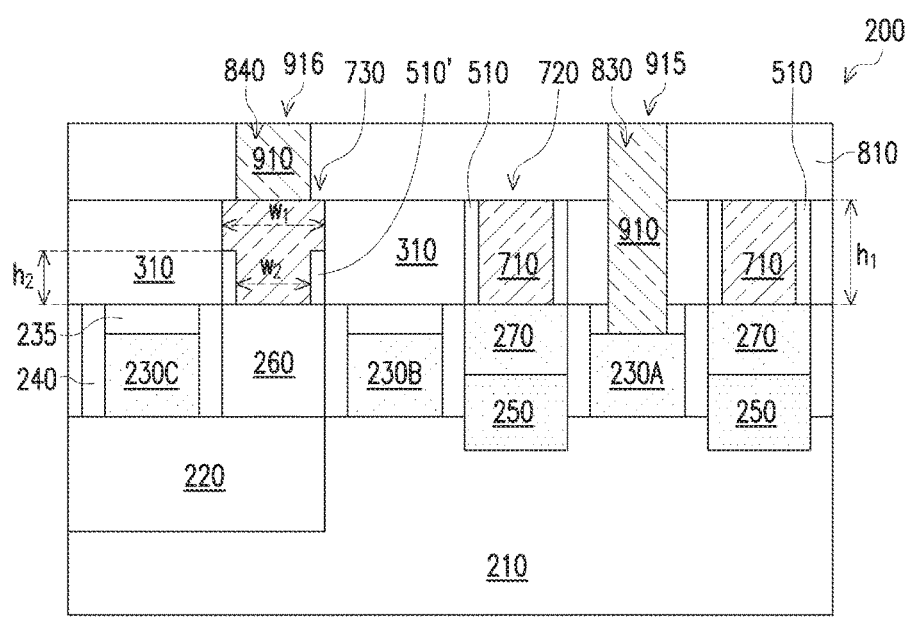

Referring to FIGS. 1 and 16, method 100 proceeds to step 130 by forming a second metal layer 910 in the second and third trenches, 830 and 840. In some embodiments, the second metal layer 910 may include W, Ti, Ag, Al, TiAlN, TaC, TaCN, TaSiN, Mn, Zr, TiN, TaN, Ru, Mo, Al, WN, Cu, and/or other suitable materials or a combination thereof. The second metal layer 910 may be formed by ALD, PVD, CVD, and/or other suitable process. Additionally, a CMP process is performed to remove excessive second metal layer 910. The CMP process provides a substantially planar top surface for the second metal layer 910 and the third dielectric layer 810. The remaining second metal layer 910 in the second trench 830 and third trench 840 forms a third metal feature 915 and a fourth metal feature 916, respectively.

In the second trench 830, the third metal feature 915 physically contacts with the HK/MG stack 230A while in the third trench 840, the fourth metal feature 916 physically contacts with the third metal feature 730. In some embodiments, the S/D contact metal 270, the first metal feature 720, the second metal feature 730, the third metal feature 915 and the fourth metal feature 916 form various multilayer interconnection structures to provide vertical and horizontal electrical routing for coupling various devices features (such S/D features 250, HK/MG stack 230A, and/or passive devices) to form a functional circuit.

The semiconductor devices, 200, may include additional features, which may be formed by subsequent processing. Additional steps can be provided before, during, and after the method 100, and some of the steps described can be replaced, eliminated, or moved around for additional embodiments of the method 100. For example, in an embodiment, step 116 (recessing the sacrificial layer 610 in the second subset trench 430B) and step 118 (bulling-back the dielectric spacers 510 in the second subset trench 430B) are implemented at one step, such that the sacrificial layer 610 and the dielectric spacer 510 are bulled-back together through the second opening 625. The etch process may include a wet etch, a dry etch, and/or a combination thereof. For example, a dry etching process may implement an oxygen-containing gas, a fluorine-containing gas (e.g., $CF_4$, $SF_6$, $CH_2F_2$, $CHF_3$, and/or $C_2F_6$).

Based on the above, it can be seen that the present disclosure provide methods of forming trenches having different depths at one etching process. The method employs forming a metal etch stop layer (ESL) structure for shallow trenches to stop etching at shallow trenches during continuously etching deeper trenches. The method also employs pulling-back sidewall spacers to forming a wider upper portion of the metal ESL structure to protect the sidewall spacers and relax process constrains. The method demonstrates suppressing shallow trench etching-through issue. The method provides a robust trench formation process with improved process window.

The present disclosure provides many different embodiments of fabricating a semiconductor device that provide one or more improvements over existing approaches. In one embodiment, a method for fabricating a semiconductor device includes forming a first dielectric layer over a substrate that includes a gate structure, forming a first trench in the first dielectric layer, forming dielectric spacers along sidewalls of the first trench, the sidewalls of the first trench being defined by the first dielectric layer and removing a portion of the dielectric spacers to expose a portion of the sidewalls of the first trench being defined by the first dielectric layer. Another portion of the dielectric spacers remains disposed within the first trench after removing the portion of the dielectric spacers. The method also includes forming a first metal feature in the first trench over the another portion of the dielectric spacers and along the exposed portions of the sidewalls of the first trench, forming a second dielectric layer over the first metal feature and the gate structure and forming a second trench through the second dielectric layer to expose a portion of the first metal feature and a third trench through the second dielectric layer and the first dielectric layer to expose a portion of the gate structure. The second trench and the third trench are formed in the same etching process.

In yet another embodiment, a method includes forming a first dielectric layer over a substrate. The first dielectric surrounds a gate structure disposed over the substrate. The method also includes forming a second dielectric layer over the first dielectric layer, forming a first trench extending through the second dielectric layer to the first dielectric layer, forming a first dielectric spacer along a sidewall of the first trench, the sidewalls of the first trench being defined by the second dielectric layer and removing a first portion of the first dielectric spacer to expose a portion of the sidewall of the first trench being defined by the second dielectric layer. A second portion of the first dielectric spacer remains disposed within the first trench after removing the first portion of the first dielectric spacer. The method also includes forming a first metal feature in the first trench along the exposed portions of the sidewalls of the first trench and on the first dielectric spacer, forming a third dielectric layer over the first metal feature and the gate structure and forming, during the same etching process, a second trench extending through the second dielectric layer to the first metal feature and a third trench extending through the third dielectric layer and the second dielectric layer to the gate structure.

In yet another embodiment, a semiconductor device includes a gate structure disposed over a substrate, a first dielectric layer disposed over the substrate, including over the gate structure. The device also includes a first metal feature disposed in the first dielectric layer, the first metal feature having an upper portion having a first width and a lower portion having a second width that is different than the first width. The device also includes a dielectric spacer disposed along the lower portion of the first metal feature. The upper portion of the first metal feature is disposed over the dielectric spacer. The device also includes a second dielectric layer disposed over the first dielectric layer, including over the first metal feature. The device also includes a second metal feature extending through the second dielectric layer to physically contact with the first metal feature and a third metal feature extending through the second dielectric layer and the first dielectric layer to physically contact the gate structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A device comprising:
   a gate structure disposed over a substrate;
   a first dielectric layer disposed over the substrate, including and over the gate structure;
   a dielectric spacer disposed along a sidewall of the first dielectric layer, wherein the dielectric spacer and the substrate are spaced apart from each other;
   a first metal feature disposed along the dielectric spacer in the first dielectric layer, with at least a portion of the first metal feature being disposed over the dielectric spacer;
   a second dielectric layer disposed over the first dielectric layer, including over the first metal feature;
   a second metal feature extending through the second dielectric layer to physically contact with the first metal feature; and
   a third metal feature extending through the second dielectric layer and the first dielectric layer to physically contact the gate structure.

2. The device of claim 1, wherein the first metal feature has an upper portion having a first width and a lower portion having a second width that is different than the first width.

3. The device of claim 1, wherein the dielectric spacer includes a first dielectric spacer portion and a second dielectric spacer portion positioned on opposite sides of the first metal feature.

4. The device of claim 1, wherein the first metal feature includes tungsten (W).

5. The device of claim 3, further comprising a third dielectric layer disposed over the substrate, the third dielectric layer extending from a bottom surface of the dielectric spacer to the substrate, and
   wherein the third dielectric layer is formed of a different material than the dielectric spacer.

6. The device of claim 1, further comprising a fourth metal feature disposed over and in physical contact with the first metal feature.

7. A device comprising:
   a gate structure disposed over a substrate;
   a second dielectric layer disposed over the substrate, and over a first dielectric layer surrounding the gate structure;
   a first metal feature disposed in the second dielectric layer, the first metal feature having an upper portion having a first width and a lower portion having a second width that is different than the first width;
   a dielectric spacer disposed along the lower portion of the first metal feature, wherein the first dielectric layer is positioned between the dielectric spacer and the substrate to prevent the dielectric spacer from interfacing with the substrate;
   a third dielectric layer disposed over the second dielectric layer, including over the first metal feature;
   a second metal feature extending through the third dielectric layer to physically contact with the first metal feature; and
   a third metal feature extending through the third dielectric layer and the second dielectric layer to physically contact the gate structure.

8. The device of claim 7, wherein the dielectric spacer includes a first dielectric spacer portion and a second dielectric spacer portion positioned on opposite sides of the first metal feature.

9. The device of claim 7, wherein the first metal feature includes tungsten (W).

10. The device of claim 7, further comprising:
    a fourth metal feature extending through the second dielectric layer; and
    another dielectric spacer disposed along the fourth metal feature.

11. The device of claim 10, further comprising:
a source/drain feature at least partially disposed within the substrate; and
a source/drain contact disposed over the source/drain feature, the source/drain contact having a top surface facing away from the substrate, and
wherein the fourth metal feature physically contacts the top surface of the source/drain contact.

12. The device of claim 11, wherein the another dielectric spacer physically contacts the top surface of the source/drain contact.

13. The device of claim 7, wherein the third metal feature physically contacts the third dielectric layer and the second dielectric layer.

14. A device comprising:
a gate structure disposed over a substrate;
a second dielectric layer disposed over the substrate, and over a first dielectric layer;
a first metal feature disposed in the second dielectric layer, the first metal feature having an upper portion having a first width and a lower portion having a second width that is different than the first width; and
a dielectric spacer disposed along the lower portion of the first metal feature, wherein the upper portion of the first metal feature is disposed over the dielectric spacer, wherein the first dielectric layer is positioned between the dielectric spacer and the substrate.

15. The device of claim 14, further comprising a third dielectric layer disposed over the second dielectric layer, including over the first metal feature.

16. The device of claim 15, further comprising a second metal feature extending through the third dielectric layer to physically contact with the first metal feature.

17. The device of claim 15, further comprising a third metal feature extending through the third dielectric layer and the second dielectric layer to physically contact the gate structure.

18. The device of claim 14, wherein the first metal feature includes tungsten (W).

19. The device of claim 14, wherein the dielectric spacer includes a first dielectric spacer portion and a second dielectric spacer portion positioned on opposite sides of the first metal feature.

20. The device of claim 14, further comprising:
a source/drain feature at least partially disposed within the substrate; and
a source/drain contact disposed over the source/drain feature, the source/drain contact having a top surface facing away from the substrate;
a second metal feature extending through the second dielectric layer to the top surface of the source/drain contact; and
another dielectric spacer disposed along the second metal feature and extending to the top surface of the source/drain contact.

\* \* \* \* \*